(12) United States Patent  
Stewart

(10) Patent No.: US 7,548,836 B2
(45) Date of Patent: Jun. 16, 2009

(54) METHOD AND APPARATUS FOR COMPENSATING FOR AC COUPLING ERRORS IN RMS MEASUREMENTS

(75) Inventor: Brian Michael Stewart, South Burlington, VT (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/261,187

(22) Filed: Oct. 27, 2005

(65) Prior Publication Data

US 2007/0100588 A1 May 3, 2007

(51) Int. Cl.
*H03F 1/26* (2006.01)
*H04B 15/00* (2006.01)
*G01R 35/00* (2006.01)

(52) U.S. Cl. .................. 702/198; 702/190; 702/107
(58) Field of Classification Search .................. 702/198
See application file for complete search history.

(56) References Cited

U.S. PATENT DOCUMENTS 4,700,244 A * 10/1987 Fasen et al. ............... 360/77.05
4,733,301 A * 3/1988 Wright, Jr. .................. 348/731
5,117,180 A 5/1992 Swerlein
5,726,963 A * 3/1998 Ohta ..................... 369/124.02
6,172,579 B1 * 1/2001 Dacus et al. ................ 332/128
2002/0040250 A1 * 4/2002 Gaikwad et al. .............. 700/37
2003/0224752 A1 * 12/2003 Rawlins et al. .............. 455/307
2005/0174180 A1 * 8/2005 Mone .......................... 331/16
2006/0077009 A1 * 4/2006 Christoffers et al. .......... 331/16

OTHER PUBLICATIONS

Tobias et al., "Second Moment Analysis Of The Filtered-X LMS Algorithm", 1999.*
UCSD ECE35 Project 5, "RC Bandpass Filter", Jan. 7, 2009.*
UCSD ECE35 Lab listing, printed Jan. 29, 2009.*
Laplace Transform Filters, printed Jan. 28, 2009.*

* cited by examiner

*Primary Examiner*—Michael P Nghiem

(57) ABSTRACT

Apparatus for compensating for a coupling error in an input signal may include a blocking correction filter. The blocking correction filter is in operable connection with an AC coupling circuit. The blocking correction filter applies to the input signal a transfer function including a settling parameter and a time constant of the AC coupling circuit.

6 Claims, 1 Drawing Sheet

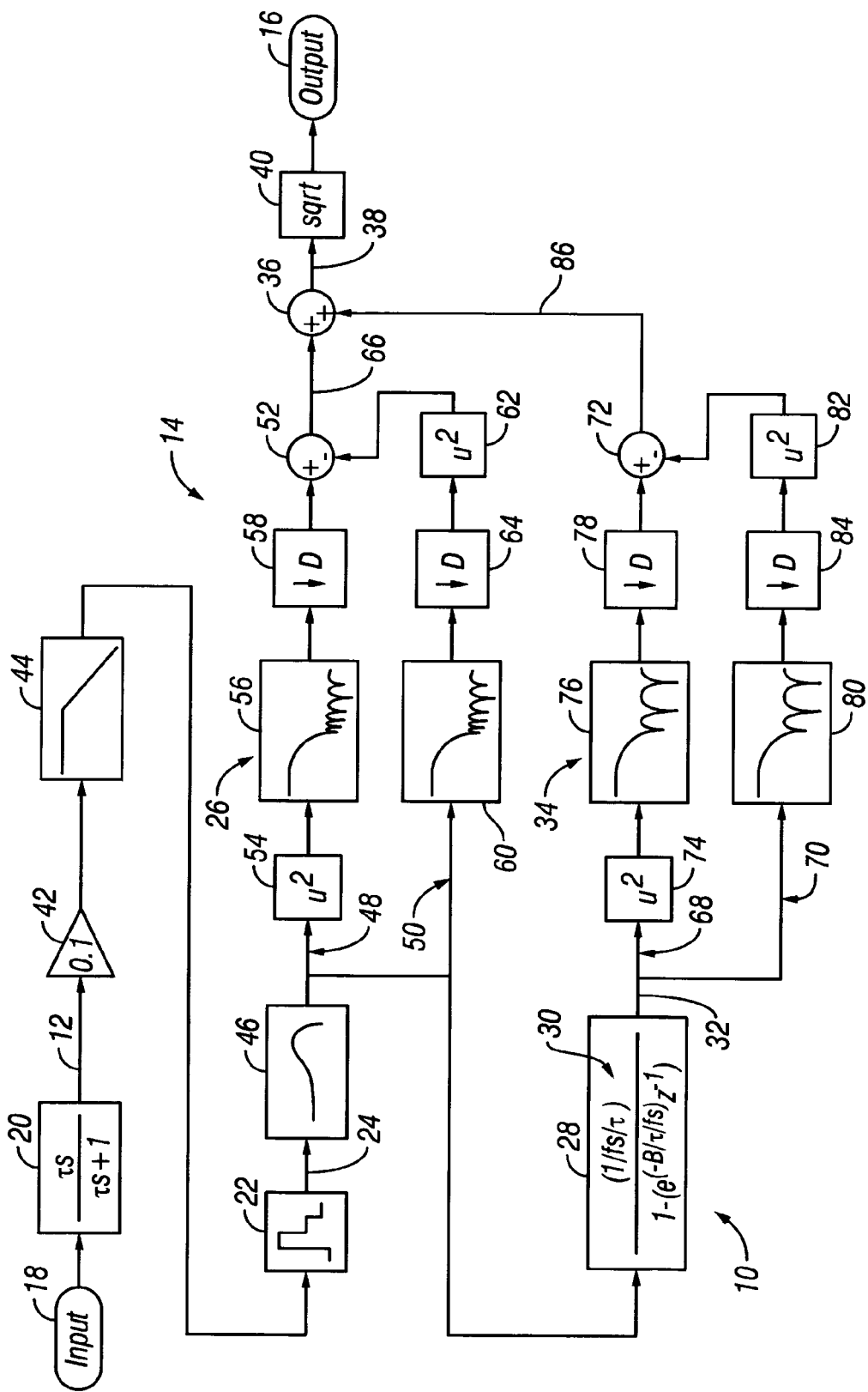

US 7,548,836 B2

METHOD AND APPARATUS FOR COMPENSATING FOR AC COUPLING ERRORS IN RMS MEASUREMENTS

TECHNICAL FIELD

This invention relates to signal processing systems in general and more specifically to systems for determining root mean square (RMS) measurements.

BACKGROUND

It is often desirable to convert an AC signal into a DC signal of equivalent power. Power is frequently characterized by the RMS or Root Mean Square, value. If the input signal is sinusoidal, an equivalent RMS value may be easily determined by filtering the rectified signal into an average value and then by applying a correction factor. However, if the input signal is not sinusoidal, a so-called true RMS measuring system must be used to accurately determine the RMS value of the non-sinusoidal signal.

While such true RMS measuring systems are known in the art and can be used to accurately determine the RMS value of a non-sinusoidal signal, they are not without their problems. For example, the accuracy of such a system may be adversely affected by a coupling circuit that may be interposed between the original signal and the RMS measuring system. An example of such a coupling circuit is an RC (i.e., resistive/capacitive) circuit that is used to filter or remove a DC component (e.g., a DC offset) of the original signal. Such a coupling circuit is commonly referred to as an AC coupling circuit, in that it allows the AC component of the signal to be passed on, while rejecting any DC component of the signal. Signals passing through an AC coupling circuit are often referred to as AC-coupled signals.

Unfortunately, however, AC coupling circuits distort the input signal, particularly at lower frequencies relative to the cut-off frequency of the AC coupling circuit. If not removed or compensated, such distortions will result in an inaccurate determination of the RMS value of the original signal, even though the RMS measuring system itself may be highly accurate. That is, the RMS value determined by the RMS measuring system is based on the distorted signal (i.e., an input signal having an AC coupling error) rather than the original signal.

While systems and methods have been developed which attempt to compensate for the AC coupling errors introduced by AC coupling circuits, they are not capable of compensating for the AC coupling errors in all circumstances. For example, compensation systems have been developed which are effective in compensating for low-frequency distortions imposed by the AC coupling circuits, but only if the input signals are sinusoidal. Another problem that must be addressed relates to the tolerances of the various components of the coupling circuit. That is, variations in the actual values (e.g., resistance and capacitance) of the components of the coupling circuit will mean that a compensation that is suitable for one set of components may be unsuitable for another set of components, even where the actual values of the other set of components are within the specified tolerances. While the selection of high-precision components may reduce this problem, the actual values of the components often change over time. Accordingly, a compensation that is suitable for new components may become unsuitable as the components age. A compensation system should not degrade for components within a tolerance range and should be adjusted for individual component values.

SUMMARY OF THE INVENTION

Apparatus for compensating for a coupling error in an input signal may include a blocking correction filter. The blocking correction filter applies to the input signal a transfer function comprising a settling parameter.

Also disclosed is apparatus for determining a second moment of an input signal having a coupling error. A first circuit is responsive to the input signal and estimates a second moment of the input signal. A blocking correction filter responsive to the input signal applies a transfer function to the input signal to produce a filtered signal. A second circuit operatively associated with the blocking correction filter estimates a second moment of the filtered signal. A combining circuit operatively associated with the first and second circuits combines the estimated second moment of the input signal and the estimated second moment of the filtered signal.

A method for determining a second moment of an input signal having a coupling error may comprise: Estimating a second moment of the input signal; filtering the input signal to produce a filtered signal, the filtered signal compensating for the coupling error in the input signal; estimating a second moment of the filtered signal; and adding the estimated second moment of the filtered signal to the estimated second moment of the input signal.

BRIEF DESCRIPTION OF THE DRAWING

The accompanying drawing illustrates a block diagram of one embodiment of apparatus for compensating for coupling errors.

DETAILED DESCRIPTION OF THE PREFERRED EMBODIMENTS

One embodiment of a compensating system 10 for compensating for a coupling error in an input signal 12 is illustrated in the drawing FIGURE as it may be utilized in an RMS measuring system 14 for measuring an RMS value of input signal 12. The RMS value may be incorporated in an output 16. In the embodiment shown and described herein, input signal 12 is derived from an original signal 18 via a coupling circuit 20. Thus, input signal 12 may contain AC coupling errors imposed by coupling circuit 20.

RMS measuring system 14 may comprise various analog and digital elements and systems suitable for conditioning input signal 12, digitizing input signal 12, and determining the RMS value of input signal 12. For example, in the embodiment illustrated in the drawing FIGURE, RMS measuring system 14 may comprise an analog-to-digital (A/D) converter 22 for converting the analog input signal 12 into a digitized input signal 24 suitable for processing by the various digital elements of RMS measuring system 14. RMS measuring system 14 may also comprise a first variance circuit 26. First variance circuit 26 is operatively associated with A/D converter 22 and receives the digitized input signal 24 produced by A/D converter 22. First variance circuit 26 estimates a variance of digitized input signal 24.

A blocking correction filter 28 is also operatively associated with the A/D converter 22. As will be described in much greater detail below, blocking correction filter 28 applies a transfer function 30 to the digitized input signal 24 to produce a filtered signal 32. Transfer function 30 substantially compensates for the AC coupling error (i.e., distortion) imposed by coupling circuit 20 on original signal 18. Briefly, the transfer function 30 of blocking correction filter 28 includes a settling parameter B that decreases the settling time of the blocking correction filter 28 but also decreases the blocking correction accuracy. In one embodiment, settling parameter B is a linear function of the time constant τ of the coupling circuit 20. The actual time constant τ of the coupling circuit 20 as well as settling parameter B may be determined in accordance with the teachings provided herein.

Selection of the settling parameter B in accordance with the teachings provided herein minimizes the accuracy variation with τ at the minimum input frequency. In addition, the selection of the settling parameter B to be a linear function of τ results in almost no variance in the correction error as a function of τ and also creates substantially uniform settling times across a range of possible τ values.

A second variance circuit 34 operatively associated with blocking correction filter 28 receives the filtered signal 32 from blocking correction filter 28. Second variance circuit 34 estimates a variance of the filtered signal 32. The estimated variances of digitized input signal 24 and filtered signal 32 are combined by a combiner circuit or node 36 to produce a compensated variance estimate 38. A square root circuit 40 operatively associated with node 36 takes the square root of the compensated variance estimate 38 to produce the estimated RMS value of input signal 12. Output 16 may comprise the estimated RMS value.

A significant advantage of the compensating system 10 shown and described herein is that it may be used to compensate for AC coupling errors in an input signal 12 regardless of whether the input signal 12 comprises a pure sinusoidal signal or a non-sinusoidal signal. Consequently, the compensating system 10 may be used to advantage in systems requiring input signals having high degrees of fidelity to the original signals and regardless of whether the signals are purely sinusoidal. For example, in one embodiment, the compensating system 10 may comprise a portion of an RMS measuring system 14 for determining the RMS value 16 of the original signal. Accordingly, the RMS value 16 determined by RMS measuring system 14 will be highly accurate of the RMS value of the original signal 18 even though the RMS measurement is performed on an input signal 12 having an AC coupling error imposed by coupling circuit 20.

Still other advantages are associated with the settling parameter B utilized by the blocking correction filter 28. For example, settling parameter B may be selected to minimize the accuracy variation with the time constant τ at the minimum input frequency. Therefore, the compensating system 10 will be relatively insensitive to variations in the time constant τ. In addition, selection of the settling parameter B in accordance with the teachings provided herein results in substantially uniform settling times across a range of possible τ values. The settling parameter B may also be calibrated to the time constant τ of the particular coupling circuit, thereby allowing the compensating system 10 to be custom-calibrated for the particular circuit. The settling parameter B may be re-calibrated from time-to-time to ensure the continued accuracy of the compensation system 10 as the components of the coupling circuit age.

Having briefly described one embodiment of a compensation system according to the teachings provided herein, as well as some of its more significant features and attributes, various embodiments of the method and apparatus of the compensation system will now be described in detail. However, before proceeding with the detailed description, it should be noted that while the compensation system 10 is shown and described herein as it may be utilized in an RMS measuring system 14 utilizing an AC coupling circuit 20 to couple the original signal 18 to the system 14, the compensation system 10 may be utilized in other applications, in other configurations, and with other types of coupling circuits, as would become apparent to persons having ordinary skill in the art after having become familiar with the teachings provided herein. Consequently, the present invention should not be regarded as limited to the particular applications, configurations, and coupling circuits shown and described herein.

Referring back now to the drawing FIGURE, one embodiment of a compensating system 10 may comprise a portion of an RMS measuring system 14 that may be operated to determine or estimate the RMS value 16 of an original signal 18. Actually, and as was briefly discussed above, RMS measuring system 14 determines the RMS value of an input signal 12 that is derived from the original signal 18 via coupling circuit 20. However, because the compensation system 10 compensates for coupling errors that may be imposed on the input signal 12 by coupling circuit 20, RMS measuring system 14 may be used to produce a highly accurate RMS value 16 of original signal 18 even though the RMS value is determined from the input signal 12 that may contain coupling errors imposed by the coupling circuit 20.

The coupling circuit 20 in one embodiment may comprise an RC (i.e., resistive/capacitive) circuit having a time constant τ. Time constant τ is related to the values of the resistance and capacitance of the various components comprising coupling circuit 20. Thus, the time constant τ of the coupling circuit 20 may vary depending on the actual resistance and capacitance of the coupling circuit. As already mentioned, these component values may change as a result of natural variations within a selected tolerance, component aging, or a combination of both.

In the embodiment shown and described herein, coupling circuit 20 may comprise a conventional AC coupling circuit 20. The Laplace transform of the transfer function of coupling circuit 20 may be written as illustrated in the drawing FIGURE, i.e., $(\tau s)/(\tau s+1)$, where τ is the time constant of coupling circuit 20 and s is the Laplace variable. Thus, coupling circuit 20 will remove a DC component of the original signal 18 to produce AC-coupled input signal 12. However, the input signal 12 will be distorted somewhat (as a result of the transfer function of coupling circuit 20), particularly at low frequencies relative to the cut-off frequency of the coupling circuit 20.

RMS measuring system 14 may also be provided with various signal conditioning and filter elements in order to condition and filter the input signal 12 as may be required or desired to determine an accurate RMS value for a range of parameters (e.g., sensitivities and bandwidths). By way of example, in one embodiment, RMS measuring system 14 may comprise a signal conditioning amplifier 42 and an anti-aliasing filter 44.

Signal conditioning amplifier 42 may comprise any of a wide range of systems and devices known in the art or that may be developed in the future that are or would be suitable for the intended application. Consequently, the present invention should not be regarded as limited to any particular type of signal conditioning amplifier 42. However, by way of example, in one embodiment, signal conditioning amplifier 42 may comprise an analog amplifier.

Anti-aliasing filter 44 may comprise a low-pass filter having a cut-off point selected so as to prevent aliasing of the input signal 12 at the particular frequencies desired to be measured. Filter 44 may comprise any of a wide range of filter types now known in the art or that may be developed in the future that are or would be suitable for the intended application. By way of example, in one embodiment, anti-aliasing filter 44 comprises an analog Butterworth filter.

RMS measuring system 14 may also comprise an analog-to-digital (A/D) converter 22 for converting the amplified and filtered input signal 12 into a digitized input signal 24. A/D converter 22 may comprise any of a wide variety of analog-to-digital converters that are now known in the art or that may be developed in the future that would be suitable for the intended application. Consequently, the RMS measuring system 14 should not be regarded as limited to any particular type of A/D converter.

The A/D converter 22 may be operated at any of a wide range of sampling frequencies ($f_s$) and resolutions suitable for the particular application. Consequently, the RMS measuring system 14 should not be regarded as limited to any particular sampling frequency or resolution. However, by way of example, in one embodiment, the A/D converter is operated at a sampling frequency ($f_s$) of about 1.5 mega-hertz (MHz), and at a resolution of 10 bits.

RMS measuring system 14 may also be provided with a flattening filter 46 to correct for the transfer functions of the signal conditioning amplifier 42, the anti-aliasing filter 44, and A/D converter 22. Flattening filter 46 may comprise any of a wide variety of digital filters having a transfer function selected to compensate for distortions imposed by the particular amplifier 42, anti-aliasing filter 44, and A/D converter 22 that may be utilized. Thus, after passing through the flatting filter 46, the digitized input signal 24 will be as "flat" as possible. However, digitized input signal 24 will still contain the AC coupling errors imposed by coupling circuit 20.

As mentioned above, a first variance circuit 26 is utilized to estimate a variance of digitized input signal 24. In the embodiment shown and described herein, first variance circuit 26 comprises a "squared" path 48 and an "unsquared" path 50. The squared path 48 estimates the second moment of the samples of the digitized signal 24, whereas the unsquared path 50 estimates the mean of the samples of the digitized signal 24. The second moment of the samples and the square of the mean of the samples are then combined at node 52 to estimate the variance of the samples. More specifically, as indicated by node 52, the square of the mean of the samples is subtracted from the second moment of the samples.

The squared path 48 may comprise a squaring circuit 54 and a low-pass filter 56. Squaring circuit 54 squares the digitized input signal 24. Low-pass filter 56 is used to attenuate frequencies of the squared digitized input signal 24 above the cut-off point of the filter 56. A down-converter 58 may also be provided, if necessary or desired, to reduce the number of output samples (i.e., output sample frequency) to some fraction of the sampling frequency $f_s$ of the A/D converter 22. Alternatively, if the settling time of the low-pass filter 56 is long compared to the sampling frequency $f_s$ of A/D converter 22, then the filtering may be implemented in a series of filter-decimate steps to reduce the amount of computation involved. Accordingly, the filter 56 will produce output samples at a frequency that is a fraction of the sampling frequency $f_s$ of A/D converter 22.

Low-pass filter 56 may be provided with any of a wide range of characteristics (e.g., cut-off frequency, roll-off, ripple, etc.) suitable for the particular signal sensitivities and bandwidths selected, as would become apparent to persons having ordinary skill in the art after having become familiar with the teachings provided herein. Consequently, the present invention should not be regarded as limited to a low-pass filter 56 having any particular characteristics. However, by way of example, in one embodiment, filter 56 may comprise a multistage filter decimate sequence that provides unity gain at DC, a stop band at 200 Hz with 120 dB rejection, and a decimation factor of about 300.

The unsquared path 50 may comprise a low-pass filter 60 and a squaring circuit 62. Low-pass filter 60 is used to attenuate frequencies above the cut-off point of filter 60. In one embodiment, low-pass filter 60 may be identical to low-pass filter 56 in the squared path 48. Squaring circuit 62 is used to square the samples of the filtered digitized input signal 24. A down-converter 64 may also be provided, if necessary or desired, to reduce the number of output samples (i.e., output sample frequency) produced by the unsquared path 50 to some fraction of the sampling frequency fs of the A/D converter 22. Alternatively, and as described above, if the settling time of the low-pass filter 60 is long compared to the sampling frequency $f_s$ of A/D converter 22, then the filtering may be implemented in a series of filter-decimate steps to reduce the amount of computation involved. Accordingly, the filter 60 will produce output samples at a frequency that is a fraction of the sampling frequency fs of A/D converter 22.

As mentioned above, the square of the mean of the samples of the digitized signal 24 estimated by the unsquared path 50 is subtracted from the second moment of the samples of the digitized signal 24 estimated by the squared path 48. This may be accomplished by providing RMS measuring system 14 with a node or combiner 52, as best seen in the drawing. The combined signal 66 is the estimate of the variance of the input signal 12.

Blocking correction filter 28 is also operatively associated with the A/D converter 22. Blocking correction filter 28 may comprise an infinite impulse response (IIR) filter that applies a transfer function 30 to the digitized input signal 24 to produce a filter signal 32. As described above, the transfer function 30 substantially compensates for the AC coupling error imposed by the coupling circuit 20 on original signal 18. As a result, the particular transfer function 30 will depend on the transfer function of the coupling circuit 20.

A suitable transfer function 30 for compensating for the transfer function of the coupling circuit 20 may be determined once the transfer function for the coupling circuit 20 is known. By way of example, the coupling circuit 20 in one embodiment comprises an RC circuit having a time constant $\tau$ that is related to the resistance and capacitance of the coupling circuit.

As described above, the Laplace transform of the transfer function of the coupling circuit 20 may be written as:

$$H_b(s) = \tau s/(\tau s+1)$$

where:

$\tau$ is the time constant of coupling circuit 20; and s is the Laplace variable.

To correct for distortions imposed by this transfer function with an additive term, a transfer function $H_c(s)$ is needed such that $$|H_b(s)|^2 + |H_c(s)|^2 = 1$$

In addition, because the transfer function 30 is to be applied after the coupling circuit 20, the transfer function 30 multiplied by the transfer function ($H_b(s)$) of the coupling circuit 20 must be equal to the additive transfer function $H_c(s)$. Thus, in the example embodiment, the transfer function 30 would be $1/(\tau s)$, again, where $\tau$ is the time constant of coupling circuit 20 and s is the Laplace variable. This represents the ideal transfer function for compensating for the transfer function of the coupling circuit 20. However, this ideal transfer function is unstable for a DC input and is very slow to settle. To stabilize the system, a settling parameter B is added to the ideal transfer function. Thus, the transfer function 30 ($H_{tf30}(s)$) becomes:

$$H_{tf30}(s)=1/(B+\tau s)$$

where:

B is the settling parameter, a positive real value;

$\tau$ is the time constant of coupling circuit 20; and s is the Laplace variable.

With the settling parameter B being a positive real value, a smaller B will provide more accuracy (i.e., closer to the ideal transfer function), but with a longer settling time.

The transfer function 30 illustrated in the drawing FIGURE is the transfer function $H_{tf30}(s)=1/(B+\tau s)$ converted from continuous time to discrete time via the impulse invariance technique. This conversion is necessary because blocking correction filter 28 operates on discrete (i.e., digital) data, rather than analog data. Thus, in discrete time, the transfer function 30 is given by:

$$H_{tf30}(z)=(1/f_s/\tau)/(1-(e^{(-B/\tau/f_s)}z^{-1}))$$

where:

$f_s$ is the sampling frequency;

$\tau$ is the time constant of coupling circuit 20;

B is the settling parameter; and

Z is the z-transform variable for discrete time systems.

As mentioned, the selection of the settling parameter B involves a trade-off between accuracy and settling time. A suitable settling parameter B may be selected as follows.

A first step involves an estimation of the time constant $\tau$ of coupling circuit 20. In the example embodiments shown and described herein, component tolerances will cause the time constant $\tau$ of coupling circuit 20 to vary between about ±10% around a nominal value $\tau_{nom}$. The time constant $\tau$ may be estimated by applying two low-frequency sinusoids of known frequency and amplitude to the measurement system 14 with the compensation system 10 disabled. The resulting two measurements may be used to compute $\tau$ based on an equation derived from the transfer function (e.g., $H_b(S)$) of the coupling circuit 20. Two frequencies are necessary because the gain of the remaining circuitry may be unknown. The first frequency should be as low as possible given the calibration system constraints. The second frequency should be sufficiently high so that the transfer function has changed significantly relative to the first frequency. Because this calibration process is sensitive to error, the relative amplitudes of the two calibration signals must be known with considerable precision. If this is not the case, the calibration process may be improved by taking two additional measurements with the coupling circuit 20 disabled. The four measurements may then be combined to estimate $\tau$ without relying on the amplitude accuracy of the calibration source.

The next step is to determine a nominal value ($B_{nom}$) for the settling parameter B for $\tau_{nom}$ that provides the desired accuracy at every frequency of interest. The error due to B for $\tau=\tau_{nom}$ may be evaluated at any frequency given the equations provided above. Generally speaking, at lower frequencies, the error due to B is larger, but the accuracy requirement is typically lower, so $B_{nom}$ should be selected with all frequencies of interest in mind. If the accuracy specifications for a planned application are flexible, settling time due to B may also be considered.

The next step in the process involves selecting a function g where $B=g(\tau)$ that minimizes the correction error across the range of possible time constants $\tau$ at a frequency f for a given $B_{nom}$ and $\tau_{nom}$. The frequency f is typically the frequency with the smallest margin relative to the specification. Generally speaking, good results can be obtained where g is a linear function (i.e., $g(\tau)=a_1\tau+a_0$). Such a linear function produces almost no variance in correction error as a function of $\tau$ and also creates nearly uniform settling times for all expected values of $\tau$. Alternatively, more complex or higher-order functions may be used, but acceptable results can usually be obtained with a linear function.

For each value of $a_1$ over a range, $a_0$ is computed using $B_{nom}$ and $\tau_{nom}$. Then, with each $a_1$ and $a_0$, the error due to B is computed across an expected range of $\tau$ values. The $a_1$ and $a_0$ values should be selected that minimize the normalized deviation over the range of $\tau$. A suitable settling parameter B may then be determined from the values selected for $a_1$, and $a_0$, and the value of $\tau$ determined by time constant estimation.

Before proceeding with the description, it should be noted that the blocking correction filter 28 may be utilized in a "sample compensation" system as well as the "measurement compensation" system shown and described herein. Stated another way, the compensation provided by blocking correction filter 28 also may comprise sample compensation, in which the samples of digitized input signal 24 are compensated before performing any measurement. For example, in an embodiment wherein the blocking correction filter 28 is utilized in a sample compensation system, blocking correction filter 28 could be placed immediately downstream of filter 46. Blocking correction filter 28 would then compensate for the AC coupling errors in digitized input signal 24. The variance of the resulting filtered signal could then be determined by first variance circuit 26. No second variance circuit 34 would be required. However, the transfer function applied by the blocking correction filter 28 would not be the same as the transfer function 30 shown and described for the measurement compensation system. Instead, the transfer function may comprise the discrete equivalent of:

$$H_{tf}(s)=(\sqrt{(B^2+1)}+\tau s)/(B+\tau s)$$

While this alternative configuration would dispense with the need for second variance circuit 34, the blocking correction filter 28 would need to run at the full sample rate of A/D converter 22. In addition, the settling time of the measurement would be longer because filters 56 and 60 are typically slower-settling filters compared to filters 76 and 80. Accordingly, while the blocking correction filter 28 shown and described herein may be utilized in a sample correction system as well as in a measurement correction system, in many applications it will be more advantageous to utilize the blocking correction filter 28 in the measurement correction of the type shown and described herein.

A second variance circuit 34 is operatively associated with the blocking correction filter 28 and receives the filtered signal 32 from blocking correction filter 28. The second variance circuit 34 estimates a variance of filtered signal 32. In the embodiment shown and described herein, second variance circuit 34 comprises a "squared" path 68 and an "unsquared" path 70. The squared path 68 estimates the second moment of the samples of the filtered signal 32, whereas the unsquared path 70 estimates the mean of the samples of the filtered signal 32. The second moment of the samples and the square of the mean of the samples are then combined at node 72 to estimate the variance of the samples. More specifically, as indicated by node 72, the square of the mean of the samples is subtracted from the second moment of the samples.

The squared path 68 may comprise a squaring circuit 74 and a low-pass filter 76. Squaring circuit 74 squares the filtered signal 32. Low-pass filter 76 is used to attenuate frequencies of the squared filtered signal 32 above the cut-off point of the filter 76. A down-converter 78 may also be provided, if necessary or desired, to reduce the number of output samples (i.e., output sample frequency) to some fraction of the sampling frequency $f_s$ of the A/D converter 22. Alternatively, if the settling rate of the low-pass filter 76 is long compared to the sampling frequency $f_s$ of A/D converter 22, then the filtering may be implemented in a series of filter-decimate steps to reduce the amount of computation involved. Accordingly, the filter 76 will produce output samples at a frequency that is a fraction of the sampling frequency $f_s$ of A/D converter 22.

Since the blocking correction filter 28 has a comparatively narrow bandwidth, blocking correction filter 28 need not be run at the sample rate of the A/D converter 22, but instead could be operated at a lower sample rate. If filter 60 is divided into a series of filter-decimate steps, it may be possible to use the output of one of the filter-decimate steps as the input to blocking correction filter 28 instead of the signal from filter 46 (i.e., the filtered digitized input signal 24). Using the output from one of the filter-decimate steps would reduce the numeric processing requirements of blocking correction filter 28 as well as subsequent processing. If the output from one of the filter-decimate steps is utilized, the filter-decimation must maintain sufficient flatness over the bandwidth for which the blocking correction filter 28 passes a significant portion of the input signal and must reject alias terms sufficiently to avoid biasing the correction.

The present invention should not be regarded as limited a filter 76 having any particular characteristics. However, by way of example, in one embodiment, filter 76 may be provided with the same rejection goals as filter 56 after accounting for the roll-down of blocking correction filter 28. Because blocking correction filter 28 rolls down, the stopband rejection of filter 76 may be less than that of filter 56. Likewise, the rejection of filter 76 can decrease as frequency increases in accordance with the roll-down of blocking correction filter 28.

The unsquared path 70 may comprise a low-pass filter 80 and a squaring circuit 82. Low-pass filter 80 is used to attenuate frequencies above the cut-off point of filter 80. In one embodiment, low-pass filter 80 may be identical to low-pass filter 76 in the squared path 68. Squaring circuit 82 is used to square the samples of the (now twice) filtered signal 32. A down-converter 84 may also be provided, if necessary or desired, to reduce the number of output samples (i.e., output sample frequency) produced by the unsquared path 70 to some fraction of the sampling frequency $f_s$ of the A/D converter 22. Alternatively, and as described above, if the settling rate of the low-pass filter 80 is long compared to the sampling frequency $f_s$ of A/D converter 22, then the filtering may be implemented in a series of filter-decimate steps to reduce the amount of computation involved. Accordingly, the filter 80 will produce output samples at a frequency that is a fraction of the sampling frequency $f_s$ of A/D converter 22.

As mentioned above, square of the mean of the samples of the filtered signal 32 estimated by the unsquared path 70 is subtracted from the second moment of the samples of the filtered signal 32 estimated by the squared path 68. This may be accomplished by providing RMS measuring system 14 with a node or combiner 72. The combined signal 86 is the estimate of the variance of the filtered signal 32.

The estimated variance 66 of input signal 12 is combined with the estimated variance 86 of filtered signal 32 at node 36 to produce a compensated variance estimate 38. A square root circuit 40 operatively associated with node 36 takes the square root of the compensated variance estimate 38 to produce the RMS value 16.

Other arrangements and modifications are possible. For example, the systems and methods shown and described herein may be utilized in conjunction with AC coupling circuits having two or more blocking capacitors. Such AC coupling circuits will typically involve transfer functions different from the transfer function shown and described herein for coupling circuit 20. The transfer function 30 of blocking correction filter 28 will need to be changed in accordance with the teachings provided herein to properly compensate for the transfer function of the particular coupling circuit. In addition, additional bandwidth settings may be utilized by selecting settling parameters appropriate for use with the desired bandwidth settings. For example, a system having three bandwidth settings may utilize three different values of the settling parameter B in order to optimize the compensation for each bandwidth setting. Still other modifications and variations are possible, as would become apparent to persons having ordinary skill in the art after having become familiar with the teachings provided herein. Consequently, having herein set forth preferred embodiments of the present invention, it is anticipated that suitable modifications can be made thereto which will nonetheless remain within the scope of the invention. The invention shall therefore only be construed in accordance with the following claims:

The invention claimed is:

1. Apparatus for compensating for a coupling error in an input signal derived from an AC coupling circuit, wherein the coupling error in said input signal is due to the AC coupling circuit having a time constant, the apparatus comprising a blocking correction filter in operable connection with the AC coupling circuit so as to receive the input signal from the AC coupling circuit thereto, said blocking correction filter having a transfer function with a settling parameter, said blocking correction filter configured to apply the transfer function to the input signal, said blocking correction filter configured to produce a filtered signal, and said transfer function being given by $1/(B+\tau s)$, where B is said settling parameter, $\tau$ is said time constant, and s is the Laplace variable.

2. Apparatus for compensating for a coupling error in an input signal derived from an AC coupling circuit, wherein the coupling error in said input signal is due to the AC coupling circuit having a time constant, the apparatus comprising a blocking correction filter in operable connection with the AC coupling circuit so as to receive the input signal from the AC coupling circuit thereto, said blocking correction filter having a transfer function with a settling parameter, said blocking correction filter configured to apply the transfer function to the input signal, said blocking correction filter configured to produce a filtered signal, and said transfer function being given by $(1/f_s/\tau)/(1-(e^{(B/\tau/f s)}z^{-1}))$ where $f_s$ is a sampling frequency, B is said settling parameter, $\tau$ is said time constant, and z is the z-transform variable for discrete time systems.

3. Apparatus for determining a second moment of an input signal having a coupling error, comprising:
   a first circuit responsive to the input signal, said first circuit making an estimate of the second moment of the input signal;
   a blocking correction filter responsive to the input signal, said blocking correction filter applying a transfer function to the input signal to produce a filtered signal;
   a second circuit operatively associated with said blocking correction filter, said second circuit making an estimate of a second moment of said filtered signal;
   a first combining circuit operatively associated with said first and second circuits, said first combining circuit combining the estimated second moment of the input signal and the estimated second moment of the filtered signal to determine the second moment of the input signal;

a first mean circuit responsive to the input signal, said first mean circuit being associated with said first circuit, said first mean circuit estimating a mean of the input signal;

a squaring circuit operatively associated with said first mean circuit, said squaring circuit squaring the estimated mean of the input signal;

a second mean circuit operatively associated with said blocking correction filter, said second mean circuit being associated with said second circuit, said second mean circuit estimating a mean of said filtered signal; and a squaring circuit operatively associated with said second mean circuit, said squaring circuit squaring the estimated mean of said filtered signal.

4. The apparatus of claim 3, further comprising:

a second combining circuit operatively associated with said first circuit and said first mean circuit, said second combining circuit combining the estimated second moment of the input signal and the squared estimated mean of the input signal to produce an estimated variance of the input signal; and a third combining circuit operatively associated with said second circuit and said second mean circuit, said third combining circuit combining the estimated second moment of the filtered signal and the squared estimated mean of the filtered signal to produce an estimated variance of the filtered signal, said second and third combining circuits being operatively associated with said first combining circuit so that said first combining circuit combines the estimated variance of the input signal and the estimated variance of the filtered signal.

5. The apparatus of claim 3, further comprising a square root circuit operatively associated with said first combining circuit, said square root circuit producing an RMS value from the combined estimated second moments.

6. The apparatus of claim 3, wherein the transfer function applied by said blocking correction filter comprises a settling parameter, said settling parameter decreasing a settling time of said transfer function.

\* \* \* \* \*